(12) United States Patent
Jang

(10) Patent No.: US 6,301,170 B2
(45) Date of Patent: Oct. 9, 2001

(54) MRAD TEST CIRCUIT, SEMICONDUCTOR MEMORY DEVICE HAVING THE SAME AND MRAD TEST METHOD

(75) Inventor: Tae-seong Jang, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/766,733

(22) Filed: Jan. 22, 2001

(30) Foreign Application Priority Data

Feb. 11, 2000 (KR) .................................................. 00-6551

(51) Int. Cl.$^7$ ...................................................... G11C 7/00
(52) U.S. Cl. ........................................ 365/201; 365/230.06
(58) Field of Search ............................... 365/201, 230.06, 365/205, 207, 208

(56) References Cited

U.S. PATENT DOCUMENTS 5,590,080 * 12/1996 Hasagawa et al. .................. 365/201
5,615,166 * 3/1997 Machida .............................. 365/201

* cited by examiner

*Primary Examiner*—Vu A. Le
(74) *Attorney, Agent, or Firm*—F. Chau & Associates, LLP

(57) ABSTRACT

A multi-row active disturb (MRAD) test circuit, a semiconductor memory device having the test circuit, and an MRAD test method are provided. The semiconductor memory device includes at least one memory array including a plurality of word lines sharing a bit line sense amplifier. Furthermore, in the semiconductor memory device, at least two word lines among the plurality of word lines, which have a bit line sense amplifier in common, are activated simultaneously in an MRAD test mode. The test circuit includes a control signal generating circuit and a row decoder. The control signal generating circuit is a circuit for generating a plurality of control signals and generates at least one activated control signal in an MRAD test mode. The row decoder activates at least two word lines by a control signal and a predetermined row address signal comprised of a plurality of bits. The test circuit and the test method provide a reduction in test time for a semiconductor memory device without increase in current consumption.

7 Claims, 4 Drawing Sheets

MRAD TEST CIRCUIT, SEMICONDUCTOR MEMORY DEVICE HAVING THE SAME AND MRAD TEST METHOD

BACKGROUND OF THE INVENTION

1. Field of the Invention

The present invention relates to a semiconductor memory device, and more particularly, to a test circuit that shortens the time required to test semiconductor memory devices and a semiconductor memory device having the same.

2. Description of the Related Art

Since the beginning of their development, semiconductor memory devices have progressed significantly, with continual increases in performance and integration. As memory sizes increases, the time required to test the memories also increases. The increased test time delays the production cycle. Thus, efforts to shorten test times are ever on-going. Circuits have been designed and added to semiconductor devices to reduce test time. Meanwhile, in order to improve the input and output speed of semiconductor memory devices, semiconductor memory devices include a plurality of banks. A plurality of bits can be simultaneously inputted to/outputted from semiconductor memory devices including a plurality of banks.

Generally, when one-time row active and data input and output commands are applied in a normal operation mode of semiconductor memory devices, only one word line is selected in one bank corresponding to an address input from the outside. Information stored in a memory cell outputted onto a selected word line is amplified by a bit line sense amplifier and then outputted to the outside. For all word lines to be selected by a row active command, a one-time row active command must be applied at times which are equivalent to the number of banks multiplied by the number of word lines within a bank. All of the components involved in inputting/outputting data to/from a semiconductor memory device must be tested in order to ensure that the device functions properly. One can readily appreciates that as memory size becomes more dense, the time required for testing the increased memory locations and support circuits must also increase.

One way to shorten test time in a semiconductor memory device is the use of a refresh cycle reduction (RCR) mode. In the RCR mode, a plurality of banks are selected by a row active command. Therefore, a plurality of word lines are simultaneously activated by a one-time row active command, which allows a reduction in the test time. However, in this mode, since word lines within a plurality of banks are selected at the same time, more bit line sense amplifiers are operated at the same time, and more current is consumed accordingly. Since there is a limit to the amount of consumable current in a semiconductor memory device, the number of word lines which can be activated at the same time in a RCR mode is limited. Accordingly, a need exists for a device and method for conducting tests of a semiconductor memory device in a speeding fashion while minimizing current consumption.

SUMMARY OF THE INVENTION

The present invention provides a semiconductor memory device that shortens testing time while minimizing the increase of current consumption.

The present invention further provides a test control circuit for controlling a predetermined test mode operation in such a way as to shorten the testing time in a semiconductor memory device.

The present invention further provides a test method of shortening the test time in a semiconductor memory device.

In one aspect of the present invention, there is provided a semiconductor memory device including at least one memory array including a plurality of word lines sharing a bit line sense amplifier. In the semiconductor device, at least two word lines among the plurality of word lines including the bit line sense amplifier are activated at the same time in a test mode.

In another aspect of the present invention, there is provided a test circuit in a semiconductor memory device including at least one memory array which has a plurality of word lines sharing a bit line sense amplifier. The test circuit according to a preferred embodiment of the invention includes a control signal generating circuit which generates a plurality of control signals at least one of which is activated in a test mode, and a row decoder which activates at least two word lines in response to the activated control signal and a predetermined row address signal comprised of a plurality of bits.

In yet anther aspect of the present invention, there is provided a test method in a semiconductor memory device including at least one memory array which has a plurality of word lines sharing a bit line sense amplifier. The test method according to a preferred embodiment of the invention includes the steps of: a) inputting a predetermined MRAD test signal through address pins; b) activating at least one control signal according to the predetermined MRAD test signal; and c) selecting at least two word lines at the same time according to the control signal and a predetermined row address signal.

The above test circuit and test method can shorten the testing time of a semiconductor memory device to be shortened without increasing current consumption.

BRIEF DESCRIPTION OF THE DRAWINGS

The above objectives and advantages of the present invention will become more apparent by describing in detail preferred embodiments thereof with reference to the attached drawings in which.

DESCRIPTION OF THE PREFERRED EMBODIMENTS

Figure 1:
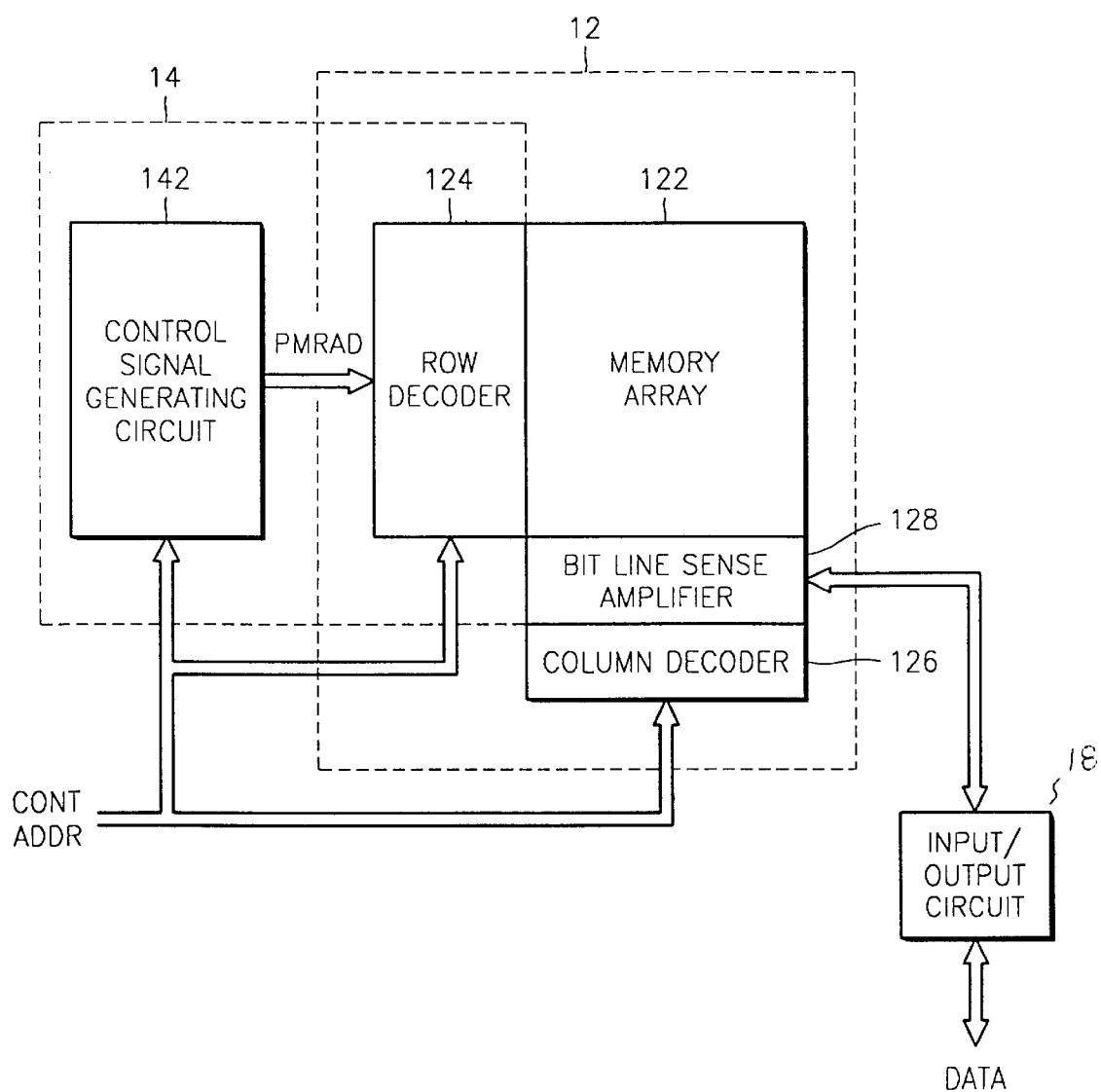
FIG. 1 is a block diagram showing a semiconductor memory device according to an embodiment of the present invention.

For convenience sake, signals and elements which perform the same function in different drawings are denoted by the same reference characters and the same reference numerals.

Referring to FIG. 1, which is a block diagram showing a semiconductor memory device according to an embodiment of the present invention, the semiconductor memory device includes at least one memory array 122 and bit line sense amplifier 128, The memory array 122 is a portion of a semiconductor memory 12 in which memory cells for storing information are in the memory array 122 arranged in columns and rows. A word line is a line connected in a row direction within the memory array, and the word line selects memory cells where data is inputted and outputted. A bit line is a line connected in a column direction within the memory array 122 to which data is inputted and outputted. One memory array 122 includes a plurality of word lines which shares one bit line sense amplifier 128. Memory cells within the memory array are selected in units of a word line. Data of the memory cells selected by a word line is outputted to the bit line to be sensed and amplified in the bit line sense amplifier 128. Among the thus-sensed and amplified data, only the data of a column selected by a column decoder 126 is finally outputted from the semiconductor memory device through an input/output circuit 18. In this case, the memory array 122 can include one or more sub-arrays, and a bit line sense amplifier can be provided for each sub-array.

The semiconductor memory device according to a preferred embodiment of the present invention includes a multi-row active disturb (MRAD) test circuit 14. The MRAD test circuit 14 includes a control signal generating circuit 142 and a row decoder 124. The MRAD test circuit according to the present invention will be described in detail with reference to FIG. 2 later.

Turning to FIG. 1, the control signal generating circuit 142 generates a plurality of control signals, which are denoted by PMRAD. At least one control signal PMRAD is activated in an MRAD test mode. In other modes, a control signal PMRAD is not activated. The MRAD test mode is a test mode in which a semiconductor memory device is tested in such a way that at least two of a plurality of word lines within the memory array 122 sharing the bit line sense amplifier 128 are activated at the same time to shorten the test time. A row decoder 124 selects and activates one or more word lines in response to a control signal PMRAD and a row address signal. In the MRAD test mode, the row decoder 124 simultaneously activates at least two of a plurality of word lines sharing the bit line sense amplifier, in response to an activated control signal PMRAD and a row address signal. In this case, the memory array 122, bit line sense amplifier 128, row decoder 124, and column decoder 126 may form a bank. Furthermore, the semiconductor memory device according to a preferred embodiment of the present invention may include a plurality of banks having such a structure.

Figure 2:
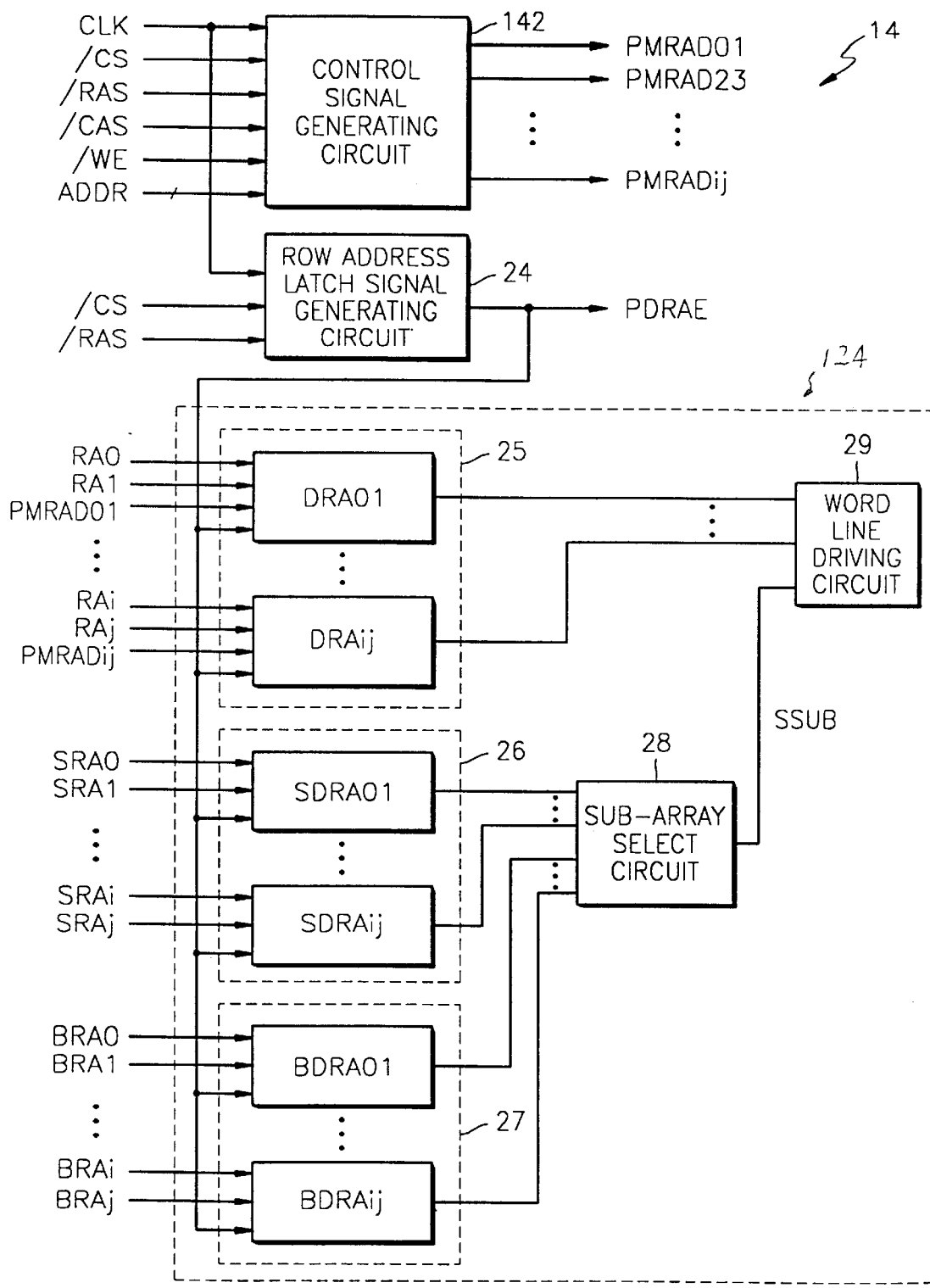
FIG. 2 is a block diagram showing a test circuit according to an embodiment of the present invention.

FIG. 2 is a block diagram showing a test circuit according to an embodiment of the present invention. The test circuit according to the present invention is called an MRAD test circuit. Referring to FIG. 2, an MRAD test circuit 14 according to a preferred embodiment of the present invention includes a control signal generating circuit 142 and a row decoder 124. Furthermore, the MRAD test circuit 14 may include a row address latch signal generating circuit 24 which generates a row address latch signal denoted by PDRAE. The row address latch signal PDRAE causes the row decoder 124 to latch a row address signal. The row address signal includes a plurality of bits and they are inputted through address pins.

In a mode other than an MRAD test mode, the control signal generating circuit 142 does not activate control signal PMRAD, and then the row decoder 124 receives for decoding a row address signal. In an MRAD test mode, the control signal generating circuit 142 generates at least one activated control signal PMRAD, and then the row decoder 124 decodes bits of a row address designated by the activated control signal PMRAD at a predetermined level. In this case, it is assumed that the predetermined level is a logic high level.

Preferably, the row decoder 124 includes a plurality of predecoders for predecoding row address signals. The row address signals are divided in units of n bits. In describing the embodiment, for convenience sake, it is assumed that row address signals in units of two bits are provided to the predecoders. Thus, control signals PMRADij selectively control each predecoder. In other words, each predecoder receives for predecoding two bits of a row address signal. It would be apparent to one ordinarily skilled in the art that a different number of bits of a row address signal can be predecoded, and that a row address signal can be decoded without the predecoding process.

The MRAD test circuit 14 is a test circuit for semiconductor memory device including a plurality of banks and sub-arrays. Thus, a row address signal is classified into a bank address BRA0-BRAj for selecting the banks, a sub-array address SRA0-SRAj, or a word line address RA0-RAj for selecting word lines within the sub-arrays. The row decoder 124 is mainly comprised of a bank decoder 27, a sub-array decoder 26, a word line decoder 25, a sub-array select circuit 28 and a word line driving circuit 29. The bank decoder 27 predecodes the bank address BRA0-BRAj, and the sub-array decoder 26 predecodes the sub-array address SRA0-SRAj. The word line decoder 25 predecodes the word line address RA0-RAj. The sub-array select circuit 28 receives output signals of the bank decoder 27 and the sub-array decoder 26 to generate a final sub-array select signal SSUB. The word line driving circuit 29 activates a word line finally selected by an output signal of the word line predecoder 25 and the sub-array select signal SSUB.

The control signal generating circuit 142 generates a plurality of control signals PMRAD01, PMRAD23, . . . , PMRADij by dividing a row address signal in units of two bits. In the illustrative embodiment according to the present invention, it is preferred that each one of the banks and sub-arrays is selected, and that two or more word lines within the sub-array are selected at the same time. Therefore, the generated control signals PMRAD01, PMRAD23, . . . , PMRADij controls the respective predecoders DRA01-DRAij within the word line decoder 25. Furthermore, it is assumed that no control signal is inputted to the sub-array decoder 26 and the bank decoder 27. However, a control signal for simultaneously selecting a plurality of banks and sub-arrays may be further generated. This means that a plurality of word lines are selected at the same time within a plurality of banks or a plurality of sub-arrays.

The word line address is comprised of bits ranging from RA0 bit to RAj bit. The control signals generated by control signal generating circuit 142 include a signal PMRAD01 for controlling predecoder DRA01 which decodes RA0 and RA1 bits of the word line address. Control signals PMRADij are generated for controlling RAi and RAj bits of the word line address. For example, control signal PMRAD23 controls predecoder DRA23.

If the semiconductor memory device goes into an MRAD test mode, the control signal generating circuit 142 activates a control signal PMRADij and inputs the control signal PMRADij to a predecoder DRAij within the row decoder 124. When the control signal PMRADij is in an activated state, the corresponding predecoder DRAij renders the received input bits RAi and RAj as 'don't care,' with circuitry under control of PMRADij to output bits corresponding to RAi and RAj at a logic high level. The predecoding operation will be described in detail with reference to FIG. 3.

The semiconductor memory device can enter into an MRAD test mode by inputting an MRAD test signal through address pins. This means that the MRAD test signal contains information denoting whether or not it is an MRAD test mode.

Figure 3:
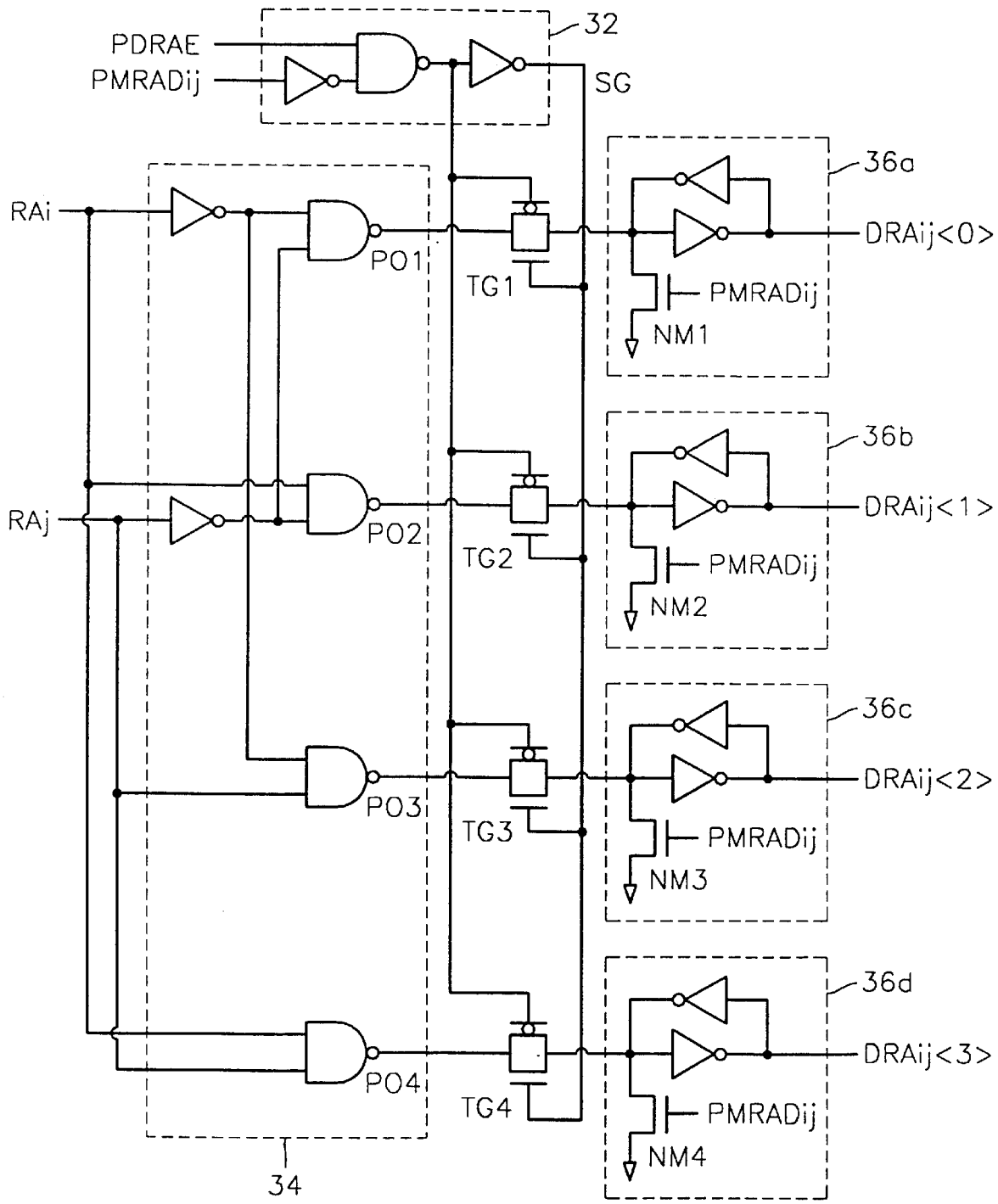
FIG. 3 is a detailed diagram showing a predecoder in the test circuit of FIG. 2.

Referring to FIG. 3, which is a detailed diagram showing a predecoder in the test circuit of FIG. 2. A predecoder DRAij in the test circuit of FIG. 2 includes a predecoding unit 34, a gating signal unit 32, $2^n$ (the nth power of 2) of switches TG1–TG4, and $2^n$ (the nth power of 2) latching units 36a–36d. In this case, n is the number of bits of a row address signal received by the predecoder DRAij. When the predecoder receives two row address bits, there should be four ($2^2$) switches TG1–TG4 and four ($2^2$) latching units 36a–36d. The predecoding unit 34 receives two bits RAi and RAj of row address signal to activate and output, depending on the value of two bits, only one of four output signals P01–P04 to the corresponding one of the four switches TG1–TG4. The gating signal unit 32 generates a gating signal SG in response to a row address latch signal PDRAE and a control signal PMRADij. The switches TG1–TG4 are turned on or turned off according to the gating signal SG. In this embodiment, the switches TG1–TG4 acts as a transmission gate which arc turned on when the gating signal SG is at logic high and turned off at logic low.

If the switches TG1–TG4 are turned on, the latching units 36a–36d receives the respective output signals P01–P04 and latches them. Conversely, if the switches TG1–TG4 are turned off, the latching units 36a–36d latch a predetermined level of signal (here, high level signal). The latching units 36a–36d have respective MOS transistors NM1–NM4 which are formed between the respective latching units and a ground voltage (GND). The respective MOS transistors NM1–NM4 are gated by control signal PMRADij. If the control signal PMRADij is in an activated state, i.e., at logic high, the switches TG1–TG4 are turned off, and the respective MOS transistors NM1–NM4 are turned on, so output signals DRAij[0]–DRAij[3] of the respective four latching units 36a–36d are all at the predetermined logic high level. Accordingly, four word lines are selected at the same time because all the four latching units 36a–36d are simultaneously at logic high level.

If the control signal PMRADij is in a deactivated state, i.e., at logic low, the switches TG1–TG4 are turned on and only one of the output signals DRAij[0]–DRAij[3] of the respective latching units 36a–36d becomes high depending on the received value of two bits of a row address signal RAi and RAj. Although the embodiment describes only one control signal PMRADij being activated, a plurality of control signals can be activated to select more word lines at the same time. The number of word lines which are simultaneously activated can be adjusted by controlling an activated control signal.

Figure 4:
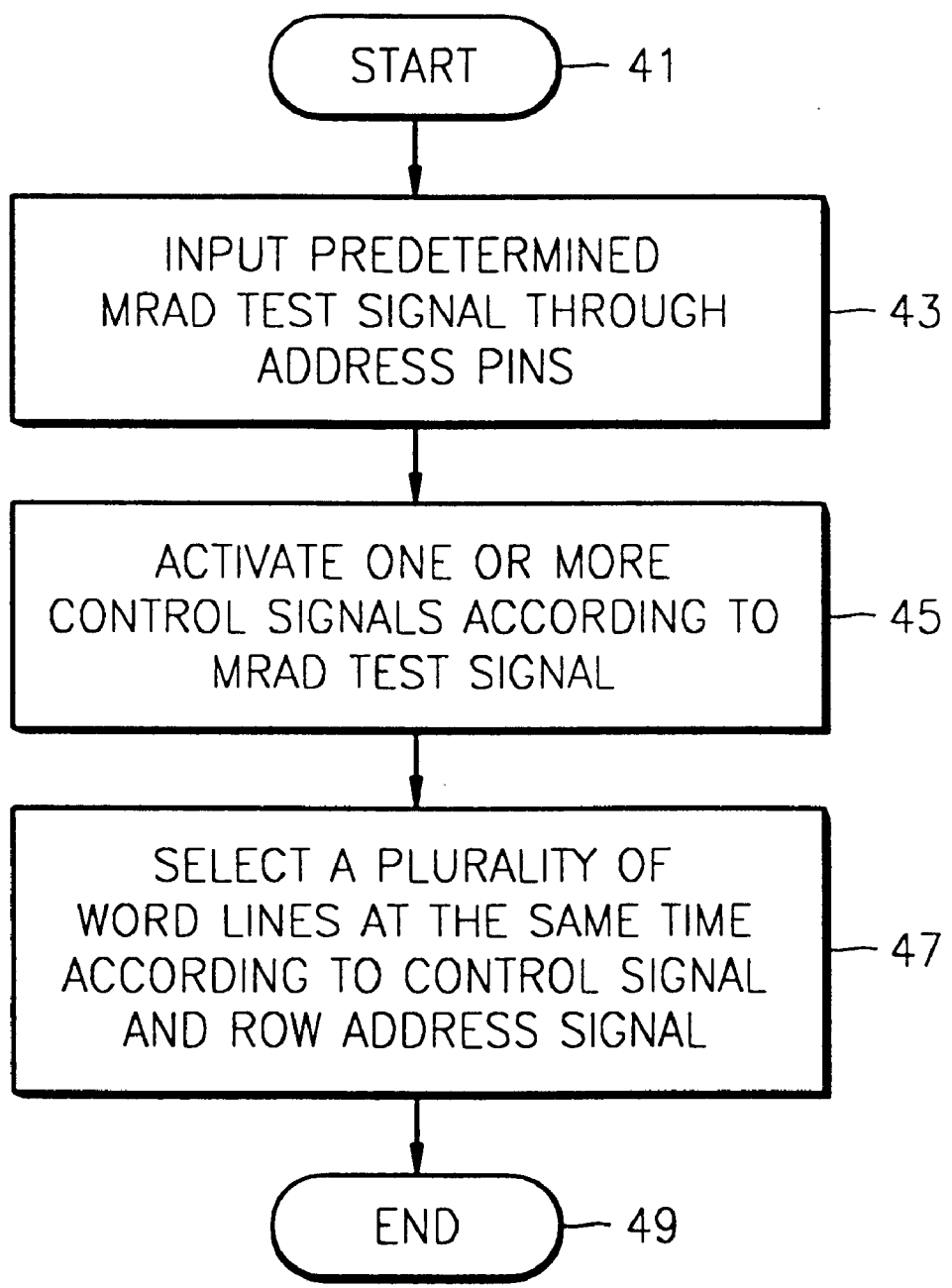
FIG. 4 is a flowchart showing a test method according to an embodiment of the present invention.

FIG. 4 is a flowchart showing a test method according to an embodiment of the present invention. Referring to FIG. 4, the test method according to the present invention mainly includes three steps. First, an MRAD test signal is inputted through address pins so that a semiconductor memory device may go into an MRAD test mode (step 43). Then, according to the input MRAD test signal, at least one control signal is activated (step 45). Finally, according to the activated control signal and the input address signal, at least two word lines are selected at the same time (step 47).

Advantageously, the test circuit and test method according to the present invention shortens the test time of a semiconductor memory device without increasing current consumption.

While this invention has been particularly shown and described with reference to a preferred embodiment thereof, it should be understood that various alternatives and modifications can be devised by those skilled in the art without departing from the spirit and scope of the invention as defined by the appended claims.

What is claimed is:

1. A semiconductor memory device comprising:
   at least one memory array including a plurality of word lines sharing a bit line sense amplifier; and
   a test circuit which simultaneously activates at least two word lines among the plurality of word lines sharing the bit line sense amplifier in a test mode, wherein the test circuit comprises:
   a control signal generating circuit which generates a plurality of control signals and at least one of which is activated in the test mode; and
   a row decoder which simultaneously activates at least two word lines in response to the activated control signal and a predetermined row address signal.

2. The semiconductor memory device of claim 1, wherein, in response to a deactivated control signal, the row decoder receives and decodes the predetermined row address signal to activate a word line, and in response to an activated control signal, the row decoder activates at least two word lines corresponding to the predetermined row address signal.

3. A test circuit in a semiconductor memory device including at least one memory array which has a plurality of word lines sharing a bit line sense amplifier, the test circuit comprising:
   a control signal generating circuit which generates a plurality of control signals and at least one of the plurality of control signals is activated in a test mode; and
   a row decoder which activates at least two word lines in response to the activated control signal and a predetermined row address signal comprised of a plurality of bits, wherein, in response to a deactivated control signal, the row decoder receives and decodes the predetermined row address signal, and in response to an activated control signal, the row decoder decodes bits designated by the activated control signal and activates at least two word lines.

4. The test circuit of claim 3, wherein the row decoder comprises a plurality of predecoders which divide a plurality of bits in the predetermined row address signal by n bits to predecode each of the n-bit row address signals, and the control signals selectively control the plurality of predecoders.

5. The test circuit of claim 4, wherein each predecoder comprises:
   a predecoding unit which receives the n bits among bits of the row address signal to generate only one activated output signal among $2^n$ output signals;
   a gating signal unit which generates a gating signal in response to a predetermined row address latch signal and a control signal input to each predecoder;
   $2^n$ switches which are turned on/off in response to the gating signal; and
   $2^n$ latching units which receive an output signal of the predecoding unit to latch the received output signal when the switches turn on, and latch the predetermined level of signal when the switches turn off.

6. The test circuit of claim 5, wherein each latching unit comprises a MOS transistor formed between the latching unit and a ground voltage, and the MOS transistor is gated by the control signal which is inputted to each predecoder.

7. A test method in a semiconductor memory device including at least one memory array which has a plurality of word lines sharing a bit line sense amplifier, the test method comprising the steps of:
   a) inputting a predetermined MRAD test signal through address pins;
   b) activating at least one control signal according to the predetermined MRAD test signal; and
   c) selecting at least two word lines at the same time according to the control signal and a predetermined row address signal.

* * * * *